United States Patent
Ito et al.

(10) Patent No.: US 11,435,951 B2
(45) Date of Patent: Sep. 6, 2022

(54) DRAM ACCESS TECHNIQUE TO REDUCE LATENCY DUE TO WRITE COMMAND LENGTH

(71) Applicant: CANON KABUSHIKI KAISHA, Tokyo (JP)

(72) Inventors: Motohisa Ito, Chiba (JP); Daisuke Shiraishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/004,240

(22) Filed: Aug. 27, 2020

(65) Prior Publication Data

US 2021/0064296 A1 Mar. 4, 2021

(30) Foreign Application Priority Data

Aug. 30, 2019 (JP) .............................. JP2019-158934

(51) Int. Cl.
*G06F 3/06* (2006.01)
*G11C 11/406* (2006.01)

(52) U.S. Cl.
CPC .......... *G06F 3/0659* (2013.01); *G06F 3/0614* (2013.01); *G06F 3/0629* (2013.01); *G06F 3/0653* (2013.01); *G06F 3/0658* (2013.01); *G06F 3/0679* (2013.01); *G11C 11/40622* (2013.01)

(58) Field of Classification Search
CPC .... G06F 3/0659; G06F 3/0614; G06F 3/0629; G06F 3/0653; G06F 3/0658; G06F 3/0679; G11C 11/40622
See application file for complete search history.

(56) References Cited

U.S. PATENT DOCUMENTS

| 6,393,512 B1* | 5/2002 | Chen | G06F 13/1647 711/5 |
| 6,505,269 B1* | 1/2003 | Potter | G06F 12/0284 711/202 |
| 10,318,420 B2* | 6/2019 | Muralimanohar | G06F 12/0811 |
| 2006/0218315 A1* | 9/2006 | Okajima | G06F 13/1605 710/35 |
| 2008/0104340 A1* | 5/2008 | Shih | G06F 13/161 711/154 |
| 2010/0030980 A1* | 2/2010 | Yamada | G06F 13/1668 711/157 |
| 2011/0035559 A1* | 2/2011 | Asai | G06F 8/4442 711/154 |

FOREIGN PATENT DOCUMENTS

JP 2005182538 A 7/2005

* cited by examiner

*Primary Examiner* — William E. Baughman
(74) *Attorney, Agent, or Firm* — Venable LLP

(57) ABSTRACT

A memory controller is able to issue a first write command for writing data of a predetermined length into a DRAM and a second write command for writing data which is less than the predetermined length in the DRAM. The memory controller includes a deciding unit configured to decide an issuance order of one or more requests stored in a storage unit. In a period from the issuance of a preceding DRAM command until a second write command targeting the same bank as the preceding DRAM command is issued, if another DRAM command targeting a bank different from the bank targeted by the preceding DRAM command can be issued, the deciding unit will decide the issuance order so that the other DRAM command that can be issued will be issued before the second write command.

20 Claims, 4 Drawing Sheets

DRAM ACCESS TECHNIQUE TO REDUCE LATENCY DUE TO WRITE COMMAND LENGTH

BACKGROUND OF THE INVENTION

Field of the Invention

The present invention relates to a memory controller and a memory control method performed in the memory controller.

Description of the Related Art

There are many kinds of memory devices, such as a DRAM (Dynamic Random Access Memory), which are used in a memory system of an information processing apparatus. Among the memory devices, the DRAM is the most frequently used memory device.

A DRAM has a large storage capacity per chip compared to other memory devices. It is also less expensive than other memory devices of the same capacity. Hence, a large-capacity memory system can be constructed inexpensively by using a DRAM. Therefore, the DRAM is widely used in memory system construction.

In LPDDR4, which is a DRAM standard that has been established in recent years, a masked write command (to be referred to as an MWR command hereinafter) has been introduced to DRAM commands for writing data. Although a conventional write command (to be referred to as a WR command hereinafter) controls a data masking operation per byte, this MWR command controls the data masking operation per burst write operation. In this manner, the implementation of the data masking operation is simplified by performing control per burst write operation. This can reduce the size and the power consumption of the DRAM.

A DRAM that receives an MWR command performs the following three steps. These steps are executed successively.
(1) Data per one access is read out from a DRAM cell.
(2) The data that has been read out is updated using write data based on a data mask signal.
(3) The updated data is written.

In the LPDDR4 standard, a parameter tCCDMW defines the minimum value of an interval required to be set open for issuing another MWR command which follows an MWR command or a WR command in the same bank. In a similar manner, a parameter tCCD defines the minimum value of an interval required to be set open for issuing another WR command which follows an MWR command or a WR command in the same bank. The operation clock cycle (to be referred to as a cycle hereinafter) of the DRAM is used as the unit of measurement for each of tCCDMW and tCCD.

As described above, the MWR command is executed in three steps. Hence, the value of tCCDMW is large compared to the value of tCCD. For example, Table 1 shows the values of tCCDMW and tCCD in the case of a burst length of 16 and a burst length of 32. As shown in Table 1, the value of tCCDMW is four times the value of tCCD. Hence, in a case in which another MWR command is to be issued following an MWR command or a WR command in the same bank, an interval which is four times that of a case in which another WR command is to be issued needs to be opened. That is, the issuance of an MWR command is accompanied by a greater penalty.

TABLE 1

| Burst Length | tCCDMW (Cycle) | tCCD (Cycle) |
|---|---|---|
| 16 | 8 | 32 |
| 32 | 16 | 64 |

Japanese Patent Laid-Open No. 2005-182538 discloses a method for suppressing the issuance of an MWR command. In the method disclosed in Japanese Patent Laid-Open No. 2005-182538, if the write data length is less than the length per access, the length of the data will be set to the length per access by adding dummy data and writing will be performed by a WR command.

SUMMARY OF THE INVENTION

However, the method disclosed in Japanese Patent-Laid Open No. 2005-182538 is problematic in that data will be unintentionally overwritten or the write data amount will increase because of the addition of the dummy data. Also, the method disclosed in Japanese Patent-Laid Open No. 2005-182538 is not applicable to a writing operation, that is, a partial write operation, for rewriting only a partial area within the length per access.

A mode of the present invention provides a technique that can reduce or eliminate the influence of a comparatively long penalty that accompanies the issuance of a write command for writing, into a DRAM, data having a length which is less than a predetermined length.

As a means for solving the above-described problem, a mode of the present invention includes the following arrangement.

A memory controller is able to issue a first write command for writing data of a predetermined length into a DRAM and a second write command for writing data which is less than the predetermined length into the DRAM. The memory controller includes a storage unit configured to store one or more requests to the DRAM; a deciding unit configured to decide an issuance order of the one or more requests stored in the storage unit; and an issuance unit configured to issue a DRAM command based on the issuance order decided by the deciding unit, wherein in a period from the issuance of a preceding DRAM command until a second write command targeting the same bank as the preceding DRAM command is issued, if another DRAM command targeting a bank different from the bank targeted by the preceding DRAM command can be issued, the deciding unit will decide the issuance order so that the other DRAM command that can be issued will be issued before the second write command.

A mode of the present invention reduces or eliminates the influence of a comparatively long penalty that accompanies the issuance of a write command for writing, into a DRAM, data having a length which is less than a predetermined length.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1:
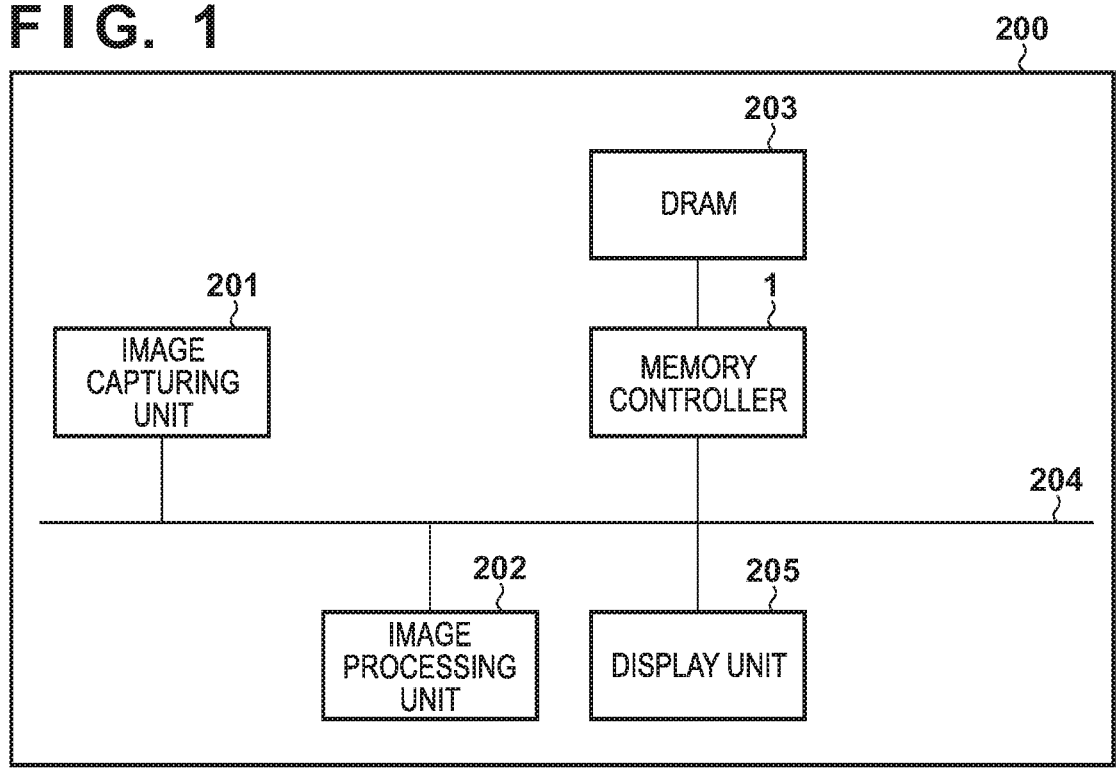
FIG. 1 is a block diagram showing the hardware arrangement of an image processing apparatus that includes a memory controller according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the first and second embodiments, the processing order of DRAM requests stored in a buffer is decided so that an RD command, a WR command, or an MWR command to another bank will be issued within a penalty period of an MWR command in a memory controller that controls a DRAM. As a result, the DRAM access transfer efficiency can be improved.

First Embodiment

FIG. 1 is a block diagram showing the hardware arrangement of an image processing apparatus 200 including a memory controller 1 according to the first embodiment. The image processing apparatus 200 is a small electronic device, for example, a smartphone or the like. The image processing apparatus 200 has a function of capturing an image of an object and displaying the captured image on a monitor in real time. Note that a case in which the image processing apparatus 200 incorporates the memory controller 1 according to the first embodiment will be described hereinafter. However, it should be obvious to a person skilled in the art who has read this specification that the memory controller 1 can be widely incorporated to general electronic devices such as a digital camera and the like.

The image processing apparatus 200 includes at least an image capturing unit 201, a DRAM 203, an image processing unit 202, a system bus 204, and the memory controller 1.

The image capturing unit 201 obtains a captured image of an object by capturing the object. The image capturing unit 201 according to this embodiment can obtain not only a still image, but also a moving image, and can output frame images which form the moving image at predetermined image capturing timings. The image processing unit 202 performs desired image processing on each image captured by the image capturing unit 201. The image processing includes general processing operations such as luminance correction, gamma correction, and the like, and a detailed description will be omitted.

The DRAM 203 is a synchronized memory that is used as a work memory for temporary storing a captured image obtained by the image capturing unit 201 and for storing a captured image that has undergone image processing by the image processing unit 202. The memory controller 1 is an interface that controls the access to the DRAM 203. The arrangement and the operation of the memory controller 1 will be described later.

A display unit 205 is a monitor that displays, at a predetermined display timing, an image that has undergone image processing by the image processing unit 202. Data is exchanged between the above-described processing units via the system bus 204. The memory controller 1 controls the access to the DRAM 203 so that a captured image obtained at a predetermined image capturing timing by the image capturing unit 201 will be processed by the image processing unit 202 and displayed at a predetermined display timing on the display unit 205.

Figure 2:
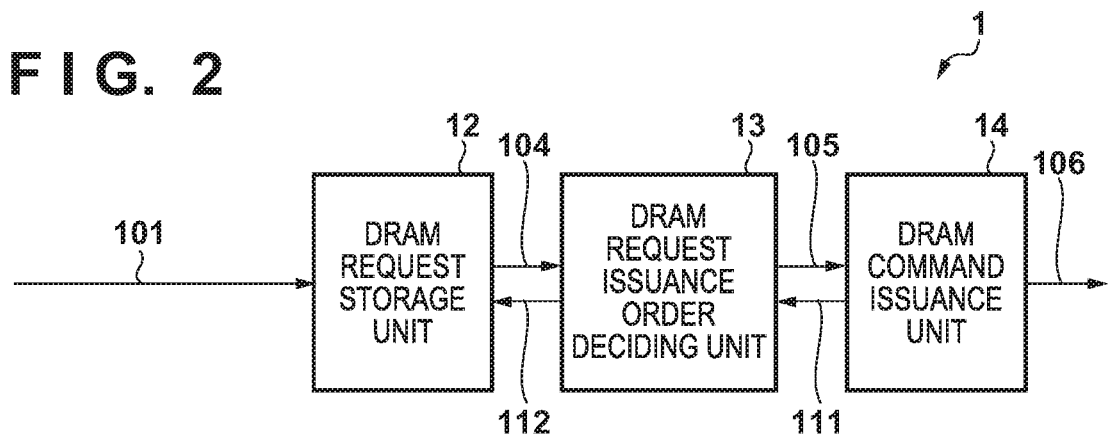
FIG. 2 is a block diagram showing the function and the arrangement of the memory controller shown in FIG. 1.

FIG. 2 is a block diagram showing the function and the arrangement of the memory controller 1. The memory controller 1 is electrically connected to the DRAM 203. The memory controller 1 and the DRAM 203 may be arranged on separate semiconductor chips or may be arranged on a single semiconductor chip. Alternatively, the DRAM 203 may be a plurality of memory devices each arranged on a separate semiconductor chip.

The DRAM 203 includes a plurality of banks, various kinds of decoders, an input/output sense amplifier, and a data bus buffer. In each bank, DRAM cells, which are storage elements, are arranged in a matrix. The DRAM 203 is a DRAM memory device that includes a first write command for writing data which has a predetermined length and a second write command for writing data which is less than a predetermined length. The DRAM 203 is formed to be in compliance with LPDDR4.

The memory controller 1 controls the DRAM 203 by providing a command (a DRAM command) and an address to the DRAM 203. The memory controller 1 transmits write data to the DRAM 203 and receives the data read out from the DRAM 203. The memory controller 1 and the DRAM 203 operate in synchronization with a common clock signal supplied from the system bus 204. For the sake of descriptive convenience, functions related to command issuance of the memory controller 1 will be mainly described below, and a description of other functions, such as the controlling of a data line (DQ) and the like of, the memory controller 1 will be omitted.

As commands for writing data into the DRAM 203, the memory controller 1 is configured to be able to issue a first write command for writing data which has a predetermined length into the DRAM 203 and a second write command for writing data which is less than the predetermined length into the DRAM.

The first write command is, for example, a WR command (write command) defined by LPDDR4. The predetermined length corresponds to length per access to the DRAM 203, is decided by at least one of a data width (or a bit width) of the DRAM 203 and a DRAM burst length, and is, in particular, length obtained by data width×DRAM burst length. A minimum interval (tCCD: Minimum Column to Column Command Delay) between commands set for the DRAM 203 is indicated by the DRAM clock cycle count of a required waiting period from the execution of a write or read command until the next write or read command is to be performed. For example, the tCCD is set to be an interval having a length which is half of the DRAM burst length. tCCD is the minimum interval (to be also referred to as a WR command penalty hereinafter) between an arbitrary command and the next WR command.

The second write command is, for example, an MWR command (Masked Write command) defined in LPDDR4. A minimum value of a length of a required waiting period from the issuance of a preceding WR command or a preceding MWR command to a given bank until the issuance of another MWR command to the same bank (or a minimum interval between the MWR command and the WR command/MWR command for the same bank) will be referred to as an MWR command penalty tCCDMWR. The MWR command penalty tCCDMWR is set to be longer than the tCCD. For example, in a case complying with LPDDR4, the MWR command penalty tCCDMWR is set to be twice the DRAM burst length, that is, four times the tCCD. Alternatively, the MWR command penalty tCCDMWR may be set to be twice, three times, five times, or, in general, N times (N is a natural number equal to or more than 2) of the tCCD. In this case, the required waiting period from the issuance of a preceding WR command or a preceding MWR command to a given bank until the issuance of another MWR command to the same bank will be longer than the minimum issuance interval (=tCCD) of a DRAM command defined in accordance with the specifications of the DRAM.

The memory controller 1 includes a DRAM request storage unit 12, a DRAM request issuance order deciding unit 13, and a DRAM command issuance unit 14. In addition, in the first embodiment, a single DRAM request is executed by a single DRAM command. Hence, a single DRAM request corresponds to a single DRAM command.

The function of the DRAM request storage unit 12 will be described first. The DRAM request storage unit 12 is a buffer for holding a request (to be referred to as a DRAM request 101 hereinafter) to the DRAM 203. The DRAM request storage unit 12 is formed by m (m is an integer equal to or more than 2) entries, and an entry number, from 0 to m−1, is added to each entry. Note that this embodiment is not limited to a specific value of m.

Figure 3:
FIG. 3 is a view for explaining an entry of a DRAM request storage unit according to the first embodiment.

Next, FIG. 3 is a view for explaining the DRAM request storage unit 12 according to the first embodiment. FIG. 3 shows one entry 31 in the DRAM request storage unit 12. Thus, in the first embodiment, m entries 31 shown in FIG. 3 are present in the DRAM request storage unit 12.

As shown in FIG. 3, each entry 31 of the DRAM request storage unit 12 includes a request type field, a target bank field, a target page field, and an MWRF field. The information stored in each field is as follows.

(a) Request Type Field
The type of the DRAM request 101 stored in the entry 31 is indicated in this field.
Example of types
WRITE This type indicates that the DRAM request 101 is a write (data write) operation.
READ This type indicates that the DRAM request 101 is a read (data read) operation.
(b) Target Bank Field
The target bank number of the DRAM request 101 stored in the entry 31 is indicated in this field.
(c) Target Page Field
The target page number of the DRAM request 101 stored in the entry 31 is indicated in this field.

(d) MWRF Field
A flag indicating whether an MWR command is to be used by the DRAM request 101 stored in the entry 31 is indicated in this field.
1'b1: The MWR command will be used
1'b0: The MWR command will not be used In a case in which another DRAM request 101 is to be newly stored in the DRAM request storage unit 12, this new DRAM request is stored in the entry 31 following the end of the DRAM request 101 which is already stored in the storage unit. When the DRAM request 101 is to be read out from the DRAM request storage unit 12, the DRAM request storage unit 12 is arranged to be able to read out the DRAM request from an arbitrary entry 31.

Table 2 is a table for explaining the operation of the DRAM request storage unit 12. In Table 2, REQ00, REQ01, REQ02, and REW03 are IDs for uniquely identifying the respective DRAM requests 101 stored in the DRAM request storage unit 12. Assume that the state of the DRAM request storage unit 12 is in a state indicated in a column "Current State" of Table 2. That is, REQ00, REQ01, and REQ02 are stored in entries 0 to 2, respectively, of the DRAM request storage unit 12. On the other hand, the DRAM requests 101 are not stored from entry 3 to the final entry m−1, and these entries are empty.

TABLE 2

| Entry | Current State | After Storage of DRAM Request | After Purge of Entry |
|---|---|---|---|
| 0 | REQ00 | REQ00 | REQ00 |
| 1 | REQ01 | REQ01 | REQ01 |
| 2 | REQ02 | REQ02 | REQ02 |
| 3 | Free | REQ03 | Free |
| 4 | Free | Free | Free |
| : | : | : | : |
| m-1 | Free | Free | Free |

The operation for storing REQ03 which is the DRAM request 101 that has been newly issued will be described next. The storage destination entry of the new DRAM request 101 is an entry following the end of the DRAM request 101 that is already stored in the DRAM request storage unit 12. Hence, in a case in which REQ03 is to be added and stored in the state indicated by the column "Current State" of Table 2, REQ03 will be stored in entry 3. The state after the storage of REQ03 is indicated in a column "After Storage of DRAM Request" of Table 2. After the storage of REQ03, the DRAM request 101 is stored in each entry from entries 0 to 3 as indicated by the column "After Storage of DRAM Request" of Table 2.

The operation for purging an entry will be described next. The DRAM request storage unit 12 purges an entry designated by a storage unit control signal 112 and simultaneously moves the DRAM request 101 which is stored in a following entry to the emptied entry. Assume that the DRAM request 101 (REQ01) of entry 1 has been purged from the state indicated by the column "After Storage of DRAM Request" of Table 2. After the purge, each of the respective DRAM requests 101 stored in entry 2 and subsequent entries moves up by one, in ascending order, to an entry of a smaller number. The state after the purge of the DRAM request 101 (REQ01) of entry 1 is indicated by a column "After Purge of Entry" of Table 2.

Returning to FIG. 2, the reference operation of each entry will be described. The DRAM request issuance order deciding unit 13 can refer to all of stored DRAM requests 104 stored in the DRAM request storage unit 12.

The operation of the DRAM request issuance order deciding unit 13 will be described. The DRAM request issuance order deciding unit 13 decides the issuance order of the stored DRAM requests 104 based on the state of the DRAM. In particular, in a penalty period from the issuance of a preceding DRAM command until the issuance of an MWR command targeting the same bank, if another DRAM command targeting a bank different from the bank targeted by the DRAM command can be issued, the DRAM request issuance order deciding unit 13 will decide the issuance order so that the other DRAM command which can be issued will be issued before the MWR command. This decision may be further based on the priority order of the DRAM request 101. Subsequently, the first DRAM request 101 to be issued after the issuance order has been decided will be output as a DRAM request 105 to be issued next.

The stored DRAM requests 104 stored in the DRAM request storage unit 12 and an issuance state signal 111 of the DRAM command which is output from the DRAM command issuance unit 14 are the inputs to the DRAM request issuance order deciding unit 13. In this case, the issuance state signal 111 is a signal indicating an issued DRAM command and information related to this DRAM command, and includes at least the signals representing the states as listed as follows.
  (a) cmd An issued DRAM command
  (b) bank A target bank of the issued DRAM command
  (c) page A target page of the issued DRAM command On the other hand, the DRAM request 105 to be issued next and the storage unit control signal 112 are the outputs from the DRAM request issuance order deciding unit 13. The DRAM request 105 to be issued next is the first DRAM request to be issued among the stored DRAM requests 104. The storage unit control signal 112 is a control signal that instructs the DRAM request storage unit 12 to purge an entry.

Figure 4:
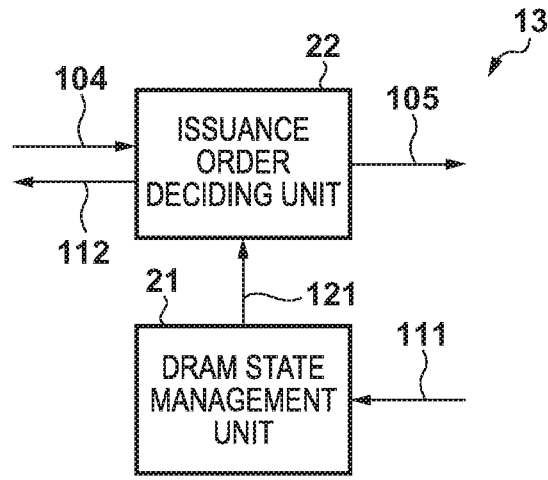
FIG. 4 is a view showing an embodiment of a DRAM request issuance order deciding unit.

The operation of the DRAM request issuance order deciding unit 13 will be described in further detail with reference to FIG. 4. FIG. 4 is a view showing an embodiment of the DRAM request issuance order deciding unit 13. In the embodiment shown in FIG. 4, the DRAM request issuance order deciding unit 13 includes a DRAM state management unit 21 and an issuance order deciding unit 22.

The DRAM state management unit 21 manages a DRAM state 121 based on a value of the issuance state signal 111. The DRAM state 121 managed by the DRAM state management unit 21 includes at least the states shown as follows. Note that in this specification, unless there is a chance of misunderstanding, an all bank refresh operation and a per-bank refresh operation will be integrally referred to as a refresh operation. Note that whether "undergoing a refresh operation" indicates "undergoing an all bank refresh operation" or indicates "undergoing a per-bank refresh operation" or indicates to either of these operations depends on the context.
  (a) ref(k) This state indicates whether bank k is undergoing a refresh operation.
    1'b1: Undergoing a refresh operation
    1'b0: Undergoing a non-refresh operation
  (b) pcmd This state indicates the type of the DRAM command issued immediately before to the DRAM 203.
    WRITE DRAM command This command indicates a data write operation
    READ DRAM command This command indicates a data read operation
  (c) padd(k) This state indicates the page address opened by bank k
  (d) bst(k) This state indicates the state of bank k
    1'b1: Bank k is in a state in which the page is opened
    1'b0: Bank k is in a state in which the page is closed
  (e) cnt(k) This state indicates the cycle count until the next MWR command can be issued.

The operation of the DRAM state management unit 21 will be described in further detail. The operation of ref(k) will be described. When the DRAM command issuance unit 14 issues an REF (REFRESH) command to bank k, the DRAM state management unit 21 sets 1'b1 in ref(k). After the refresh operation time has elapsed, the DRAM state management unit 21 sets 1'b0 in ref(k). For example, assume that the DRAM command issuance unit 14 has issued an REF command to bank 0. In this case, the value of the issuance state signal 111 will change to
  (cmd, bank, page)=(REF,0,-)
Here, "-" represents "don't care". Based on this change, the DRAM state management unit 21 recognizes the start of the refresh operation on bank 0. 1'b1 is set to ref(0) by the recognition of the start of the refresh operation.

pcmd holds the type of the DRAM command that was issued immediately before. For example, assume that the DRAM command issuance unit 14 has issued a WR command to page 0 of bank 0. In this case, the issuance state signal 111 will change to
  (cmd, bank, page)=(WR, 0, 0)
The DRAM state management unit 21 will recognize the issuance of the WR command as a result of this change, and it will set WRITE as the type of the WR command in pcmd.

padd(k) and bst(k) each show the state of bank k. When the DRAM command issuance unit 14 issues an ACT (ACTIVATE) command to page p of bank k, the DRAM state management unit 21 recognizes that page p of bank k has been opened. Subsequently, the following operations are performed.
  (a) p is set in padd(k).
  (b) 1'b1 (valid) is set in bst(k).

On the other hand, when the DRAM command issuance unit 14 issues a PRE (PRECHARGE) command to page p of bank k, the DRAM state management unit 21 recognizes that bank k has closed. Subsequently, the next operation is performed.
  (a) 1'b0 is set to bst(k).
Note that the value of padd(k) does not change.

For example, assume that the DRAM command issuance unit 14 has issued an ACT command to page 5 of bank 0. In this case, the issuance state signal 111 will change to
  (cmd, bank, page)=(ACT, 0, 5)
The DRAM state management unit 21 will execute the following operations based on this change.
  (a) 5 is set in padd(0)
  (b) 1'b1 is set in bst(0)

In contrast, assume that the DRAM command issuance unit 14 issues a PRE command to page 5 of bank 0. In this case, the issuance state signal 111 will change to
  (cmd, bank, page)=(PRE, 0, 5)
The DRAM state management unit 21 will execute the following operation based on this change.
  (a) 1'b0 is set in bst(0)

cnt(k) represents the cycle count until the next MWR command can be issued to bank k. The value of cnt(k) will change in accordance with the following conditions.
  (a) Issuance of a WR Command or an MWR Command to Bank k
    The value of the parameter tCCDMWR is set in cnt(k).

(b) No Issuance of a WR Command or an MWR Command and Cnt(k) is not 0

The value of cnt(k) is subtracted by 1 {cnt(k)=cnt(k)−1}.

(c) No Issuance of a WR Command or an MWR Command and Cnt(k) is 0

The value of cnt(k) is held.

Figure 5:
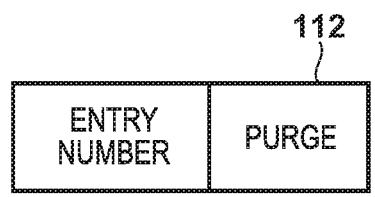
FIG. 5 is a view showing an embodiment of a storage unit control signal.

The storage unit control signal 112 will be described. FIG. 5 is a view showing an embodiment of the storage unit control signal 112. The storage unit control signal 112 shown in FIG. 5 includes an entry number field and a purge field. The operations of the fields are as follows.

(a) The Entry Number Field

This field indicates the control target entry of the DRAM request storage unit 12.

(b) The Purge Field

This field indicates that the entry of the DRAM request storage unit 12 indicated in the entry number field will be purged.

1'b1: Purge

1'b0: No purge operation

Returning to FIG. 4, the operation of the issuance order deciding unit 22 will be described. Note that a bank that is set as the target of the stored DRAM request 104 will be abbreviated as a target bank, and a page set as the target in a similar manner will be referred to as a target page hereinafter.

The issuance order deciding unit 22 decides the issuance order of the stored DRAM request 104 based on the following criteria and outputs the DRAM request 105 to be issued next.

(A) Whether the target bank of the decision target stored DRAM request 104 is undergoing a refresh operation.

(B) Whether the type of the DRAM command corresponding to the decision target stored DRAM request 104 and the type of the DRAM command issued immediately before match.

(C) Whether the target page of the decision target stored DRAM request 104 is open.

(D) Whether the value of cnt(k) is 0 {cnt(k)==0} in case in which the DRAM command corresponding to the decision target stored DRAM request 104 is an MWR command.

The criterion (D) described above is a required criterion that is to be always applied when the issuance order of the stored DRAM request 104 is to be decided. However, the criteria (A) to (C) other than the criterion (D) may be applied individually or a plurality of criteria may be applied simultaneously. Also, in this embodiment, if a plurality of the stored DRAM requests 104 satisfy the criteria, the DRAM request 101 with the smallest entry number among the stored DRAM requests 104 satisfying the criteria will be selected. Furthermore, if all of the stored DRAM requests 104 do not satisfy the criteria, the DRAM request 101 with the smallest entry number among the stored DRAM requests 104 will be selected.

The operation for deciding the issuance order of the stored DRAM request 104 will be described with reference to the four examples of conditions A to D. Table 3 and Table 4 that indicate the state of the DRAM request storage unit 12 will be used as a reference in this description. In this case, the values of the respective fields of the entries 31 shown in FIG. 3 are indicated for each DRAM request 101 in Table 3 and Table 4.

TABLE 3

| Entry | Request Type | Target Bank | Target Page | MWRF |
|---|---|---|---|---|
| 0 | WRITE | 0 | 0 | 0 |
| 1 | WRITE | 0 | 1 | 1 |
| 2 | READ | 0 | 0 | 0 |
| 3 | WRITE | 1 | 0 | 1 |
| 4 | WRITE | 2 | 0 | 0 |
| 5 | WRITE | 1 | 1 | 1 |
| 6 | READ | 1 | 0 | 0 |
| 7 | WRITE | 1 | 1 | 0 |
| 8 | WRITE | 2 | 1 | 0 |
| ⋮ | | | | |
| m-1 | | | | |

TABLE 4

| Entry | Request Type | Target Bank | Target Page | MWRF |
|---|---|---|---|---|
| 0 | WRITE | 2 | 1 | 0 |
| 1 | WRITE | 1 | 1 | 0 |
| 2 | READ | 0 | 0 | 0 |
| 3 | WRITE | 0 | 0 | 1 |
| 4 | WRITE | 0 | 0 | 0 |
| 5 | WRITE | 1 | 0 | 1 |
| 6 | READ | 1 | 0 | 0 |
| 7 | WRITE | 1 | 1 | 1 |
| 8 | WRITE | 2 | 1 | 1 |
| ⋮ | | | | |
| m-1 | | | | |

The MWRF column in each of Table 3 and Table 4 will be described. The MWRF column in each of Table 3 and Table 4 shows the value of the MWRF field of each entry 31 which stores the DRAM request. Since a single DRAM request is executed by a single DRAM command in the first embodiment, the MWRF column in each of Table 3 and Table 4 shows whether the DRAM command corresponding to the DRAM request is an MWR command. Hence, in a case in which the value of the MWRF column in each of Table 3 and Table 4 is 1'b1, the corresponding DRAM command will be an MWR command. The DRAM command corresponding to the DRAM request will be an MWR command in a case in which the following conditions are completely satisfied.

(a) The request type of the DRAM request is WRITE.

(b) An invalid byte is present in the write data.

In addition, an invalid byte is present in the write data in a case in which one of the following conditions is satisfied.

(a) The start address of the data write area does not match the boundary of a write block.

(b) The end address of the data write area does not match the boundary of a write block.

(c) The strobe information of the write data is indicated to be "invalid".

Note that there is no dependence between the DRAM requests 101 listed in Table 3 and Table 4. Hence, the execution order of the DRAM requests 101 listed in each of Table 3 and Table 4 can be changed arbitrarily.

The condition A is shown below. Note that the DRAM state is described in only the information necessary for this description.

(Condition A)

Selection Criteria

Criterion (A) The target bank is not undergoing a refresh operation.

Criterion (D) The value of cnt(k) is 0 in the case of an MWR command.

State of DRAM Request Storage Unit 12

TABLE 3

| DRAM States | |
|---|---|
| (a) ref(0) = = 1'b1 | Bank 0 is undergoing a refresh operation. |
| ref(1) = = 1'b0 | Bank 1 is undergoing a non-refresh operation. |
| ref(2) = = 1'b0 | Bank 2 is undergoing a non-refresh operation. |
| (e) cnt(1) = = 4 | 4 cycles until an MWR command can be issued to bank 1. |
| cnt(2) = = 0 | 0 cycles until an MWR command can be issued to bank 2. |

In Table 3, entries that satisfy the criterion (A) are entries 3 to 8 having, as the target banks, banks 1 and 2 which are undergoing the non-refresh operation. Among these entries, the entries which also satisfy the criterion (D) are entry 4, entry 6, entry 7, and entry 8. Since the issuance order will be decided by selecting the DRAM request 101 with the smallest entry number in a case in which a plurality of candidates are present, entry 4 which has the smallest entry number will be decided to be the request to be issued next as the DRAM request. Hence, the DRAM request 101 of entry 4 will be the DRAM request 105 to be issued next.

As described above, under the condition A, the DRAM request 101 of entry 4 is issued ahead of the DRAM request 101 of entry 3. The value of the MWRF column of the DRAM request 101 of entry 3 is 1'b1, and an MWR command will be issued. However, as shown by the DRAM state described above, the cnt value, that is, cnt(0) of bank 1 as the target bank of entry 3 is 4. Hence, a time period of four cycles needs to elapse until an MWR command can be issued. If the DRAM request 101 of entry 3 is decided to be the request to be issued next, an extra time period of four cycles needs to elapse until the DRAM request 101 can be issued, and this will be a penalty. However, the memory controller 1 according to this embodiment can suppress the generation of this penalty by issuing entry 4 ahead.

An example of the operation under a condition B will be described. In the condition B, the value of cnt(1) of the DRAM state (e) is 0 and is different from that of the condition A. The other DRAM states, the selection criteria, the state of the DRAM request storage unit 12 are the same as those of the condition A.

(Condition B)
Selection Criteria
Criterion (A) The target bank is not undergoing a refresh operation.
Criterion (D) The value of cnt(k) is 0 in the case of an MWR command.
State of DRAM Request Storage Unit 12

TABLE 3

| DRAM States | |
|---|---|
| (a) ref(0) = = 1'b1 | Bank 0 is undergoing a refresh operation. |
| ref(1) = = 1'b0 | Bank 1 is undergoing a non-refresh operation. |
| ref(2) = = 1'b0 | Bank 2 is undergoing a non-refresh operation. |
| (e) cnt(1) = = 0 | 0 cycle until an MWR command can be issued to bank 1. |

TABLE 3-continued

| DRAM States | |
|---|---|
| cnt(2) = = 0 | 0 cycle until an MWR command can be issued to bank 2. |

In Table 3, the entries that satisfy the criterion (A) are entries 3 to 8. Entries 3 to 8 also satisfy the criterion (D). Hence, the DRAM request 101 stored in entry 3 which has the smallest entry number is decided to be the request to be issued next. The DRAM request 101 of entry 3 is set as the DRAM request 105 to be issued next.

As described above, under the condition B, the DRAM request 101 of entry 3 is issued. Although an MWR command will be issued from entry 3 as described in the condition A, the value of cnt(0) is 0, and a penalty is not generated until the MWR command can be issued. Since the penalty is not generated, the DRAM request 101 of entry 3 can be issued.

An example of the operation under a condition C will be described. The selection criteria of the condition C include the criterion (A), the criterion (B), the criterion (C), and the criterion (D), and the DRAM states are to be in the states as follows. Also, assume that WRITE is the type of the DRAM issued immediately before. Note that the state of the DRAM request storage unit 12 is Table 4.

(Condition C)
Selection Criteria
Criterion (A) The target bank is not undergoing a refresh operation.
Criterion (B) The type of the DRAM command and the type of the DRAM command issued immediately before match.
Criterion (C) The target page is open.
Criterion (D) The value of cnt(k) is 0 in the case of an MWR command.
State of DRAM Request Storage Unit 12

TABLE 4

| DRAM States | |
|---|---|
| (a) ref(0) = = 1'b1 | Bank 0 is undergoing a refresh operation. |
| ref(1) = = 1'b0 | Bank 1 is undergoing a non-refresh operation. |
| ref(2) = = 1'b0 | Bank 2 is undergoing a non-refresh operation. |
| (b) pcmd = = WRITE | The DRAM command issued immediately before is WRITE |
| (c) padd(1) = = 0 | Page 0 is the target of bank 1. |
| padd(2) = = 1 | Page 1 is the target of bank 2. |
| (d) bst(1) = = 1 | Page 0 of bank 1 is open |
| bst(2) = = 1 | Page 1 of bank 2 is open |
| (e) cnt(1) = = 4 | 4 cycles until an MWR command can be issued to bank 1. |
| cnt(2) = = 0 | 0 cycle until an MWR command can be issued to bank 2. |

In Table 4, the entries that satisfy all of the criteria (A) to (C) are entry 0, entry 5, and entry 8. However, entry 5 does not satisfy the criterion (D). On the other hand, entry 0 and entry 8 also satisfy the criterion (D). Hence, the DRAM request 101 stored in entry 0 is decided to be a request to be issued next. Entry 0 of the DRAM request 101 is set as the DRAM request 105 to be issued next.

As described above, the DRAM request 101 stored in entry 0 is issued next in condition C. An MWR command will be issued by the DRAM request 101 of entry 5, but a penalty of four cycles is required until the issuance of the MWR command since cnt(0) is 4. However, the memory controller 1 according to this embodiment suppresses the generation of this penalty by issuing, before entry 5, entry 0 that was stored ahead in the DRAM request storage unit 12 but was unissued due to the execution of reordering.

The procedure by which the issuance order deciding unit 22 generates the storage unit control signal 112 to purge an entry of the DRAM request storage unit 12 will be described. In the first embodiment, a single DRAM request is executed by a single DRAM command. Hence, when a DRAM command is issued by the DRAM command issuance unit 14, the operation of the corresponding DRAM request 101 is completed. Therefore, if the issuance of a DRAM command is indicated by the issuance state signal 111, the issuance order deciding unit 22 will generate and output the storage unit control signal 112 so the corresponding DRAM request 101 will be purged.

For example, assume that the state of the DRAM request storage unit 12 is in a state shown in Table 3. At this time, assume that the DRAM request 101 of entry 7 is set to as the DRAM request 105 to be issued next as a result of deciding the issuance order of the DRAM request 101. When the DRAM command issuance unit 14 issues a WR command which is the DRAM command corresponding to the DRAM request 101 of entry 7, the value of the issuance state signal 111 changes to (cmd, bank, page)=(WR, 1, 0)

Upon detecting this change, the issuance order deciding unit 22 will decide that the issuance of the corresponding DRAM command has been completed, generate the storage unit control signal 112 to purge entry 7, and outputs the generated signal to the DRAM request storage unit 12. At this time, the values of the respective fields of the storage unit control signal 112 to be generated are as follows.

| | |
|---|---|
| (a) Entry number field | 7 |
| (b) Purge field | 1'b1 |

Returning to FIG. 2, the function of the DRAM command issuance unit 14 will be described. The DRAM command issuance unit 14 will issue a DRAM command based on the issuance order decided by the DRAM request issuance order deciding unit 13. The DRAM command issuance unit 14 generates, based on the information of the DRAM request 105 to be issued next, a DRAM command to be issued next to the DRAM 203, and issues the generated DRAM command to the DRAM 203. The DRAM command issuance unit 14 simultaneously outputs the issuance state signal 111 to the DRAM request issuance order deciding unit 13.

In the memory controller 1 according to this embodiment, the issuance order of the DRAM commands is decided based on whether the MWR command for writing data, which has a length less than the predetermined data length of the DRAM 203, into the DRAM 203 has been generated. Hence, it will be possible to suppress the reduction of the memory access efficiency or increase the memory access efficiency by reducing the influence of the penalty generated when data having a length less than the predetermined length is to be written.

In the memory controller 1 according to this embodiment, even in a case in which an MWR command is generated in accordance with the execution of a partial write operation, a penalty generated due to the MWR command can be reduced so as to suppress or eliminate a reduction in the efficiency of the data write operation.

Although the first embodiment described a case in which the issuance order of the DRAM requests 101 stored in the DRAM request storage unit 12 is decided based on the DRAM state, the present invention is not limited to this. For example, the issuance order may be decided based on another criterion other than the criteria (A) to (C), for example, the priority order of the DRAM requests 101 in addition to the criterion (D) related to the DRAM state.

Second Embodiment

Figure 6:
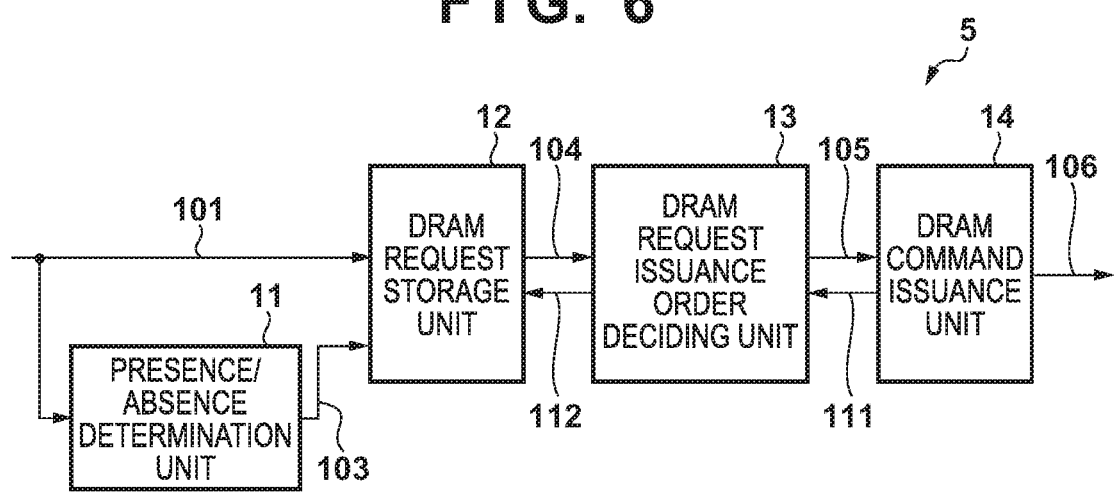
FIG. 6 is a block diagram showing the functions and the arrangement of a memory controller according to the second embodiment.

FIG. 6 is a block diagram showing the function and the arrangement of a memory controller 5 according to the second embodiment. The memory controller 5 according to this embodiment includes, in addition to a memory controller 1 according to the first embodiment, an MWR command presence/absence determination unit 11. Also, in a similar manner to the first embodiment, assume that a WR command is used as a first write command for writing data which has a predetermined length in a DRAM 203 and an MWR command is used as a second write command for writing data which is less than a predetermined length in the DRAM 203.

Note that a single DRAM request 101 was executed by a single DRAM command in the first embodiment. However, in the second embodiment, the single DRAM request 101 can be executed by a DRAM command string formed from a plurality of DRAM commands.

The memory controller 5 according to this embodiment will be described in detail with reference to FIG. 6. Functions which have been newly added in the second embodiment and functions different from those of the first embodiment will be mainly described in the second embodiment. On the other hand, a description of functions which are the same as those of the first embodiment will be omitted.

The MWR command presence/absence determination unit 11 determines whether a write request to the DRAM 203 requires an MWR command based on (1) the start address and the burst length of the write request or (2) the data strobe information related to the write request. The MWR command presence/absence determination unit 11 determines whether the each of the DRAM commands in the DRAM command string generated from the DRAM request 101 is an MWR command, and assigns the determination result to an MWRF 103 which is a flag variable having a variable length. The MWRF 103 is identification information for identifying whether each of the plurality of DRAM commands corresponding to the DRAM request 101 is an MWR command. In this case, the determination result of an n-th DRAM command of the DRAM command string will be assigned to the n-th bit of the MWRF 103. For example, the value of MWRF(0) indicates a determination result of the 0th, that is, the starting DRAM command of the DRAM command string.

In the second embodiment, a bit value of the MWRF 103 is defined as follows.

(a) The corresponding DRAM command is an MWR command 1'b1 (valid)
(b) The corresponding DRAM command is other than the MWR command 1'b0 (invalid)

For example, consider a DRAM command string which is formed from the following four DRAM commands.

| | |
|---|---|
| DRAM command(0) | MWR command |
| DRAM command(1) | WR command |

| | |
|---|---|
| DRAM command(2) | MWR command |
| DRAM command(3) | MWR command |

At this this time, the value of the MWRF 103 for each bit is as follows.

MWRF(0)==1'b1: DRAM command(0) is an MWR command

MWRF(1)==1'b0: DRAM command(1) is a WR command

MWRF(2)==1'b1: DRAM command(2) is an MWR command

MWRF(3)==1'b1: DRAM command(3) is an MWR command

Hence, the value of the MWRF 103 will be 4'b1101.

Figure 7:
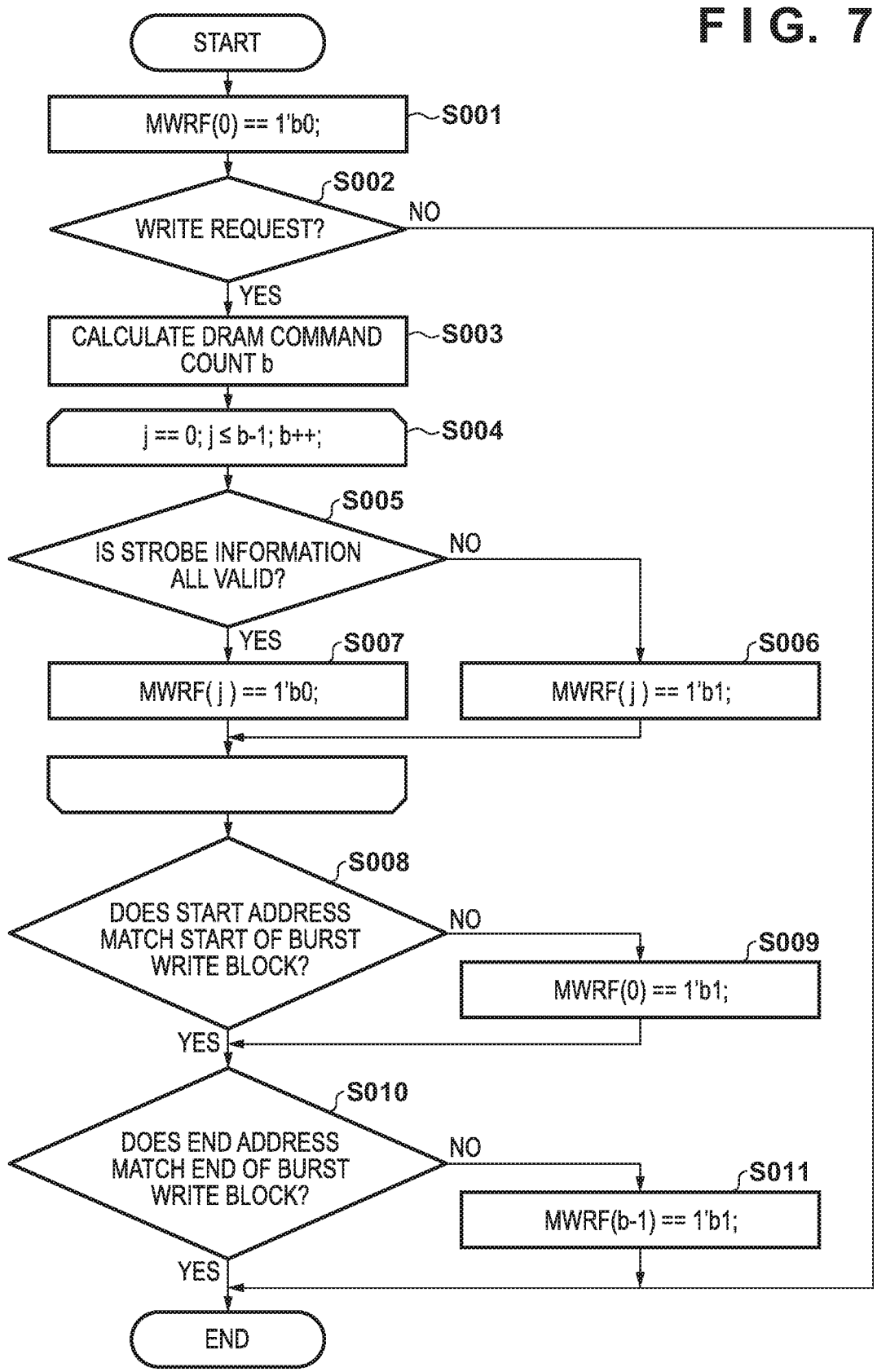
FIG. 7 is a flowchart showing the procedure of a series of determination processing operations in a MWR command presence/absence determination unit.

The operation of the MWR command presence/absence determination unit 11 will be described in detail with reference to FIG. 7. FIG. 7 is a flowchart showing a series of determination processing procedures of the MWR command presence/absence determination unit 11. This determination processing determines, by targeting a DRAM command string generated from the DRAM request 101, whether each of the DRAM commands is an MWR command, and it assigns the determination result to the MWRF 103.

In step S001, 1'b0 is assigned to MWRF(0), and initialization is performed. In step S002, if it is determined that the type of the DRAM request is WRITE, the process branches to step S003. Otherwise, the generation of the MWRF 103 is ended. In step S003, the number of the DRAM commands included in the DRAM command string corresponding to the DRAM request 101 is calculated. The calculated result is represented by a variable b.

Based on the result of the process of step S003, the number of DRAM commands included in the DRAM command string is determined to be b.

Hence, in step S004, the processes of steps S004 to S007 are repeated in a loop for b times from a bit 0 to a bit b-1. In step S005, whether the all of the pieces of the write data strobe information corresponding to the j-th DRAM command are valid is determined. If all of the pieces of the write data strobe information are valid, the process will branch to step S007. On the other hand, if it is determined that a piece of invalid write data strobe information is present, the process will branch to step S006. In step S006, based on the result from the determination process of step S005, it is determined that an invalid byte is present in the data to be written by the j-th DRAM command. Hence, it is determined that the j-th DRAM command is not a WR command, but an MWR command. Since the MWR command will be used, 1'b1 is assigned to MWRF(j). In step S007, based on the result from the determination process of step S005, it is determined that an invalid byte is not present in the data to be written by the j-th DRAM command. Hence, it is determined that the j-th DRAM command is a WR command. Since the WR command will be used, 1'b0 is assigned to MWRF(j).

In step S008, in a case in which the start address of the data to be written by the DRAM request 101 does not match the start of the burst writing block, an MWR command will be used instead of a WR command. Hence, whether the start address of the data to be written by the DRAM request 101 matches the start of the burst write block will be determined in step S008. If it is determined that the start address matches the start of the burst write block, the process branches to step S010. Otherwise, the process branches to step S009.

The operation of step S008 will be described with reference to an example. Assume that the burst length and the data width are the following values, respectively, in this description.

| | |
|---|---|
| (a) burst length | 16 |
| (b) data width | 32 bits (4 bytes) |

Under these above-described conditions, burst write block==16*32 bits/8=64 bytes Hence, to determine whether the start address matches the start of the burst write block, the lower 6 bits of the start address can be compared to a constant 6'b000000. If the lower 6 bits match the constant, it can be determined that the start address matches the start of the burst write block. On the other hand, if the lower 6 bits do not match the constant, it can be determined that the start address is not the start of the burst write block. Therefore, an MWR command will need to be used since the write operation will need to be performed from the middle of the burst write block.

In step S009, since the start address does not match the start of the burst write block, the 0th DRAM command will use an MWR command. Hence, 1'b1 will be set in the bit 0 of the MWRF 103.

In step S010, whether the final address (end address) of the data to be written by the DRAM request 101 matches the end of the burst write block. If the final address matches the end of the burst write block, the generation of the MWRF 103 will end. Otherwise, the process branches to step S011.

The operation of step S010 will be described with reference to an example. Assume that various conditions of the burst write block are the same as the conditions applied in the description of step S008. Thus, the size of the burst write block is 16*32 bits/8=64 bytes. Hence, in this example, the lower 6 bits of the end address of the burst write block are 6'b111111. Therefore, the lower 6 bits of the end address can be compared to a constant 6'b111111 to determine whether the end address matches the end of the burst write block. If the lower 6 bits match the end, it can be determined that the end address matches the end of the burst write block. On the other hand, if the lower 6 bits do not match the end, it can be determined that the end address is not the end of the burst write block. Therefore, an MWR command will need to be used since the write operation will end in the middle of the burst write block.

In step S011, since the end address does not match the end of the burst write block, the b-1th DRAM command will use an MWR command. Hence, 1'b1 will be set in the bit b-1 of the MWRF 103.

Figure 8:
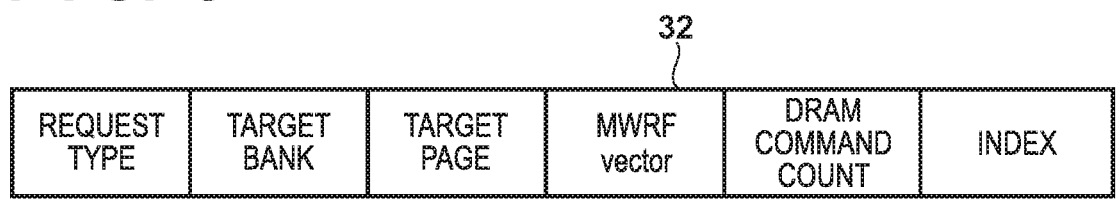
FIG. 8 is a view showing one entry of a DRAM request storage unit according to the second embodiment.

The operation of a DRAM request storage unit 12 according to the second embodiment will be described. FIG. 8 is a view showing one entry 32 of the DRAM request storage unit 12 according to the second embodiment. As shown in FIG. 8, the entry 32 of the DRAM request storage unit 12 includes a request type field, a target bank field, a target page field, an MWRF vector field, a DRAM command count field, and an index field. Among these, the request type field, the target bank field, and the target page field are the same as those of an entry 31 of the DRAM request storage unit according to the first embodiment shown in FIG. 3. Hence, the operations of the MWRF vector field, the DRAM command count field, and the index field which are fields different from those of the first embodiment will be described.

(a) MWRF Vector Field

This field shows the use state of the MWR command of the DRAM request 101 stored in the entry 32. In the second embodiment, one DRAM request 101 is executed by a DRAM command string formed by a plurality of DRAM commands. Hence, the flag for indicating whether an MWR command is to be used will be indicated in the form of a vector, and each of the bits will correspond to a DRAM command. The value indicated by each bit is similar to that in the first embodiment and is defined as follows.

1'b1: an MWR command is used
1'b0: the MWR command is not used (b) DRAM Command Count Field This field indicates the number of DRAM commands included in a DRAM command string which is to execute (or corresponds to) the DRAM request 101 stored in the entry 32.

(c) Index Field

This field indicates the position of the DRAM command to be issued next in the DRAM command string corresponding to the DRAM request 101 stored in the entry 32.

The operation for newly storing the DRAM request 101 in the DRAM request storage unit 12 is similar to that of the first embodiment. That is, the new DRAM request 101 is stored in an entry following the end of the DRAM request 101 stored in the DRAM request storage unit 12.

Figure 9:
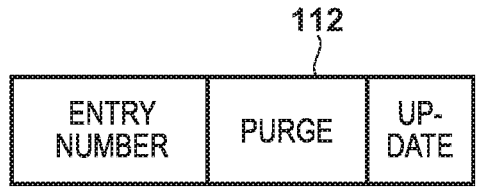
FIG. 9 is a view showing an example of a storage unit control signal according to the second embodiment.

A storage unit control signal 112 according to the second embodiment will be described. FIG. 9 is a view showing an example of the storage unit control signal 112 according to the second embodiment. The storage unit control signal 112 shown in FIG. 9 includes an entry number field, a purge field, and an update field. Among these, the entry number field and the purge field are the same as those of the storage unit control signal 112 according to the first embodiment shown in FIG. 5. Hence, the operation of the update field will be described.

(c) Update Field

This field indicates that the index field of the target entry of the DRAM request storage unit 12 indicated by the entry number field will be updated.

1'b1: the value of the index field will be incremented by 1
1'b0: no updating operation will be performed The purge operation according to the second embodiment will be described. In the second embodiment, one DRAM request 101 is executed by a DRAM command string formed by a plurality of DRAM commands. Hence, after all of the DRAM commands forming the DRAM command string have been executed, the entry of the DRAM request storage unit 12 will be purged. The operation to move up each of the respective DRAM requests 101 stored in the subsequent entries by one in ascending order after the entry has been emptied after the purge is similar to that of the first embodiment.

The operation of a DRAM request issuance order deciding unit 13 according to the second embodiment will be described. In a similar manner to the first embodiment, the DRAM request issuance order deciding unit 13 according to the second embodiment includes a DRAM state management unit 21 and an issuance order deciding unit 22. In this case, the operation of the DRAM state management unit 21 according to the second embodiment is similar to that of the first embodiment. On the other hand, the operation of the issuance order deciding unit 22 according to the second embodiment is different from the operation of the issuance order deciding unit 22 according to the first embodiment. Hence, operation processes of the issuance order deciding unit 22 according to the second embodiment that differ from those of the issuance order deciding unit 22 according to the first embodiment will be mainly described hereinafter.

In order to describe the operation of the issuance order deciding unit 22 according to the second embodiment, Table 5 which shows the state of the DRAM request storage unit 12 will be used. An "Index" column in Table 5 is a DRAM command string which is to execute the DRAM request 101 stored in the entry, and indicates the position of the next DRAM command to be issued next. For example, if the value of the "Index" column in Table 5 is 0, the 0th, that is, the start DRAM command is the DRAM command to be issued next.

TABLE 5

| Entry | Request Type | Target Bank | Target Page | MWRF Vector | DRAM Command Count | Index |
|---|---|---|---|---|---|---|
| 0 | WRITE | 0 | 0 | 0000 | 4 | 0 |
| 1 | WRITE | 0 | 1 | 1001 | 4 | 0 |
| 2 | READ | 0 | 0 | 0 | 8 | 2 |
| 3 | WRITE | 1 | 0 | 1111 | 4 | 1 |
| 4 | WRITE | 2 | 0 | 0000 | 4 | 3 |
| 5 | WRITE | 1 | 1 | 1010 | 4 | 3 |
| 6 | READ | 1 | 0 | 0 | 1 | 0 |
| 7 | WRITE | 1 | 1 | 1100 | 4 | 0 |
| 8 | WRITE | 2 | 1 | 0000 | 4 | 0 |
| . | | | | | | |
| . | | | | | | |
| . | | | | | | |
| m−1 | | | | | | |

Among the criteria used to decide the issuance order by the issuance order deciding unit 22 according to the second embodiment, criteria (A) to (C) are similar to those of the first embodiment. However, since one DRAM request 101 is to be executed by a DRAM command string formed by a plurality of DRAM commands, the precondition of a criterion (D) differs from that of the first embodiment. That is, the target of the MWR command presence/absence determination will be the DRAM command to be issued next which is indicated in the index field of the entry 32. Hence, the criterion (D) for deciding the issuance order according to the second embodiment is as follows.

The value of cnt(k) is 0 in a case in which the DRAM command to be issued next indicated in the index field of the entry 32 is an MWR command.

The operation by which the issuance order deciding unit 22 according to the second embodiment decides the issuance order of stored DRAM requests 104 by applying the criteria (A) to (D) is the same as that of the first embodiment. In addition, the operation by which the issuance order deciding unit 22 according to the second embodiment outputs the DRAM request 101, which is to be issued first after the deciding the issuance order, as a DRAM request 105 to be issued next is the same as that of the first embodiment.

The procedure by which the issuance order deciding unit 22 generates the storage unit control signal 112 will be described. In the second embodiment, a single DRAM request is executed by a DRAM command string formed by a plurality of DRAM commands. The position of the DRAM command to be issued next in the DRAM command string is indicated by the index field of the entry 32. Hence, the issuance order deciding unit 22 will also generate a signal for updating the index field of the entry 32 in addition to the signal for purging the entry 32.

The operation of the corresponding DRAM request 101 is completed by the issuance of the final DRAM command forming the DRAM command string. Hence, the purge field of the storage unit control signal 112 which is a signal for purging the entry 32 will be valid under the following conditions.

(a) An issuance state signal 111 indicates that a DRAM command has been issued (b) The issued DRAM command is the final DRAM command.

On the other hand, in a case in which a DRAM command which forms the DRAM command is issued, the index field is updated. However, the index field need not be updated in a case in which the final DRAM command has been issued. Hence, the update field of the storage unit control signal 112 will be valid under the following conditions.

(a) The issuance state signal 111 indicates that a DRAM command has been issued.

(b) The issued DRAM command is not the final DRAM command.

Whether the issued DRAM command is the final DRAM command forming the DRAM command string will be determined based on the value of the DRAM command count field and the value of the index field of the entry 32. In this case, letting c be the value of the DRAM command count field and idx be the value of the index field, idx==c−1

This equation indicates that the DRAM command to be issued next is the final DRAM command which is forming the DRAM command string. Hence, in a case in which the issuance state signal 111 indicates that a DRAM command has been issued and (idx==c−1), the issuance order deciding unit 22 will generate the storage unit control signal 112 to purge the corresponding DRAM request 101 and will output the generated signal.

For example, assume that the state of the DRAM request storage unit 12 is set to the state shown in Table 5. At this time, assume that, as a result of deciding the issuance order of the DRAM request 101, the DRAM request 105 to be issued next becomes the DRAM request 101 of entry 4.

When a DRAM command issuance unit 14 issues a WR command which is the DRAM command corresponding to the DRAM request 101 of entry 4, the value of the issuance state signal 111 will change to (cmd, bank, page)==(WR, 1, 0)

At this time, since the value of the "Index" column is 3 and the value of the DRAM command count field is 4, idx==c−1

3==4−1=3 are established. Hence, the issuance order deciding unit 22 will determine that the issuance of all of the DRAM commands forming the DRAM command string has been completed, generate the storage unit control signal 112 to purge entry 4, and output the generated signal to the DRAM request storage unit 12. At this time, the values of the respective fields of the storage unit control signal 112 to be generated will be as follows.

| (a) The entry number field | 4 |
| (b) The purge field | 1'b1 |
| (c) The update field | 1'b0 |

In a case in which the issuance state signal 111 indicates that a DRAM command has been issued and (idx!=c−1), the issuance order deciding unit 22 will generate the storage unit control signal 112 to update the index field of the corresponding DRAM request 101 and output the generated signal. At this time, the values of the respective fields of the storage unit control signal 112 to be generated will be as follows.

| (a) The entry number field | 4 |
| (b) The purge field | 1'b0 |
| (c) The update field | 1'b1 |

The function of the DRAM command issuance unit 14 according to the second embodiment will be described. The operation of the DRAM command issuance unit 14 according to the second embodiment is similar to that of the first embodiment.

Effects similar to the effects to be obtained by the memory controller 1 according to the first embodiment can also be obtained by the memory controller 5 according to the second embodiment.

Although the second embodiment described a case in which the issuance order of the DRAM requests 101 stored in the DRAM request storage unit 12 is decided based on the DRAM state, the present invention is not limited to this. For example, the issuance order may be decided based on another criterion other than the criteria (A) to (C), for example, the priority order of the DRAM requests 101 in addition to the criterion (D) related to the DRAM state.

(Simulation)

A simulation result showing the effects of the memory controller 5 according to the second embodiment will be described hereinafter. The preconditions of the simulation are as follows.

3200 Mbps in compliance with LPDDR4

WL (Write Latency)=14 cycles

BL (Burst Length)=16 cycles

Data Width of DRAM 203=32 bits

Page of DRAM 203=4 kilobytes

Penalty

PageMiss (WR->*)=110 cycles

Penalty of Masked Write=32 cycles

Under the preconditions described above, a case in which two modules compete to write and transfer image data of 4000×2000 pixels for each horizontal line was simulated. The data amount per pixel was 4.5 bytes. Page dependency was absent between the two modules.

(1) A Case in which the Start Address of Each Line is Aligned Per DRAM Command (64 Bytes)

In this case, only the final DRAM command of each line will be an MWR command. According to a conventional method, the transfer efficiency was 79.5%. In the method according to the method according to the second embodiment, the transfer efficiency was 80.4%, thereby increasing the transfer efficiency by 0.9%.

(2) A Case in which the Start Address of Each Line is not Aligned Per DRAM Command (64 Bytes)

In this case, both the start DRAM command and the final DRAM command of each line will be an MWR command. Hence, it can be expected that the transfer efficiency will decrease more than the case of (1) unless a particular measure is taken. In fact, the transfer efficiency decreased to 78.6% in the simulation according to the conventional method, and the transfer efficiency was degraded more than the case of (1) by 0.9%. In contrast, in the simulation by the method according to the second embodiment, the transfer efficiency was 80.4%, and a transfer efficiency equal to that of the case of (1) was obtained. Compared to the conventional method, the transfer efficiency increased by 1.8%.

The operation and the arrangement of the memory controller according the above-described embodiments have been described. These embodiments are merely examples, and it should be obvious to a person skilled in the art that various modifications can be made to the combination of the components and the processes and such modifications thereof fall within the scope of the present invention.

Although the first and second embodiments described a case in which the memory controller has a storage function and a deciding function, the present invention is not limited to this. For example, a preceding-stage circuit that has these functions may be arranged on a preceding stage of a conventional memory controller.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-158934, filed Aug. 30, 2019, which is hereby incorporated by reference herein in its entirety.

What is claimed is:

1. A memory controller that is configured to be able to issue a first write command for writing data of a predetermined length into a DRAM and a second write command for writing data which is less than the predetermined length into the DRAM, comprising:
   a storage unit configured to store one or more requests to the DRAM;
   a deciding unit configured to decide an issuance order of the one or more requests stored in the storage unit; and
   an issuance unit configured to issue a DRAM command based on the issuance order decided by the deciding unit,
   wherein in a period from the issuance of a preceding DRAM command until a second write command targeting the same bank as the preceding DRAM command is issued, if another DRAM command targeting a bank different from the bank targeted by the preceding DRAM command can be issued, the deciding unit decides the issuance order so that the other DRAM command that can be issued is to be issued before the second write command.

2. The controller according to claim 1, wherein the predetermined length is a length per access to the DRAM.

3. The controller according to claim 1, wherein the predetermined length is decided based on a data width of the DRAM.

4. The controller according to claim 1, wherein the predetermined length is decided based on a burst length of the DRAM.

5. The controller according to claim 1, wherein the period is set to be longer than a minimum issuance interval of a DRAM command defined by a DRAM specification.

6. The controller according to claim 5, wherein the period is set to be N times (N is a natural number not less than 2) of the minimum issuance interval.

7. The controller according to claim 1, wherein the deciding unit further decides the issuance order based on whether the type of a DRAM command corresponding to a decision target request matches the type of a DRAM command which has been issued immediately before.

8. The controller according to claim 1, wherein the deciding unit further decides the issuance order based on whether a bank which is the target of a decision target request is undergoing a per-bank refresh operation.

9. The controller according to claim 1, wherein the deciding unit further decides the issuance order based on whether a page which is the target of a decision target request is open.

10. The controller according to claim 1, further comprising:
    a determination unit configured to determine whether a write request to the DRAM requires the second write command.

11. The controller according to claim 10, wherein the determination unit determines, based on a start address and a burst length of a write request, whether the write request to the DRAM requires the second write command.

12. The controller according to claim 10, wherein the determination unit determines, based on data strobe information related to the write request, whether the write request to the DRAM requires the second write command.

13. The controller according to claim 10, wherein the determination unit generates, for each of a plurality of DRAM commands corresponding to the write request to the DRAM, identification information for identifying whether the DRAM command is the second write command, and the deciding unit refers to the generated identification information.

14. The controller according to claim 1, wherein the storage unit includes a plurality of entries, each of which corresponds to a request, and
    the storage unit is configured to be able to read out a request from an arbitrary entry.

15. The controller according to claim 1, wherein the deciding unit decides the issuance order based further on a priority order of the request.

16. The controller according to claim 1, further comprising:
    a management unit configured to manage a state of the DRAM,
    wherein the deciding unit decides the issuance order of a request by referring to the state of the DRAM managed by the management unit.

17. The controller according to claim 16, wherein the management unit manages a refresh operation state of the DRAM.

18. The controller according to claim 16, wherein the management unit manages an open state of a page of each bank of the DRAM.

19. The controller according to claim 1, wherein the second write command is a masked write command.

20. A memory control method executed by a memory controller that is configured to be able to issue a first write command for writing data of a predetermined length into a DRAM and a second write command for writing data which is less than the predetermined length into the DRAM, the memory controller including a storage unit configured to store one or more requests to the DRAM, the method comprising:
    deciding an issuance order of the one or more requests stored in the storage unit; and
    issuing a DRAM command based on the decided issuance order,
    wherein in a period from the issuance of a preceding DRAM command until a second write command targeting the same bank as the preceding DRAM command is issued, if another DRAM command targeting a bank different from the bank targeted by the preceding DRAM command can be issued, the deciding comprises deciding the issuance order so that the other DRAM command that can be issued is to be issued before the second write command.

* * * * *